United States Patent [19]

Allen et al.

[11] Patent Number: 5,282,176
[45] Date of Patent: Jan. 25, 1994

[54] HIGH SPEED INPUT RECEIVER AND WORDLINE DRIVER CIRCUIT

[75] Inventors: Michael J. Allen, Rescue; Terry L. Baucom, Folsom, both of Calif.

[73] Assignee: Intel Corporation, Santa Clara, Calif.

[21] Appl. No.: 954,011

[22] Filed: Sep. 30, 1992

[51] Int. Cl.$^5$ ............................................. G11C 7/00
[52] U.S. Cl. ........................ 365/230.06; 365/189.11; 307/475
[58] Field of Search ...................... 365/230.06, 189.11; 307/451, 475, 443

[56] References Cited

U.S. PATENT DOCUMENTS 4,953,133  8/1990  Kashimura .................... 365/230.06

Primary Examiner—Eugene R. LaRoche
Assistant Examiner—Andrew Tran
Attorney, Agent, or Firm—Blakely, Sokoloff, Taylor & Zafman

[57] ABSTRACT

An apparatus and method of increasing the speed of an input receiver circuit directly interfaces the wordlines of a memory array. The speed of the input receiver and wordline driver circuit is improved by means of an inverter and a look-ahead n-channel transistor coupled to the basic wordline driver buffer.

4 Claims, 2 Drawing Sheets

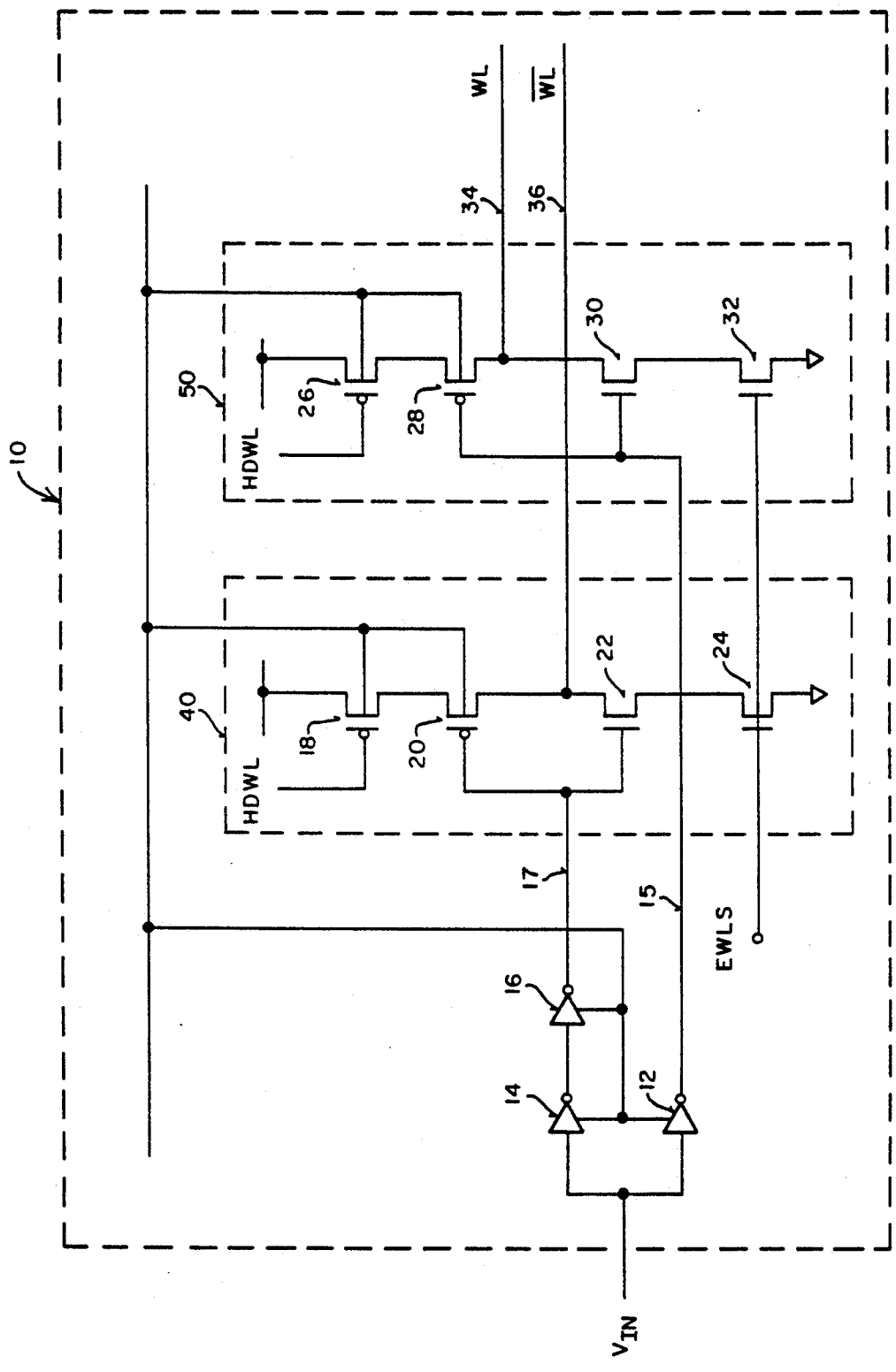
FIG__1 (PRIOR ART)

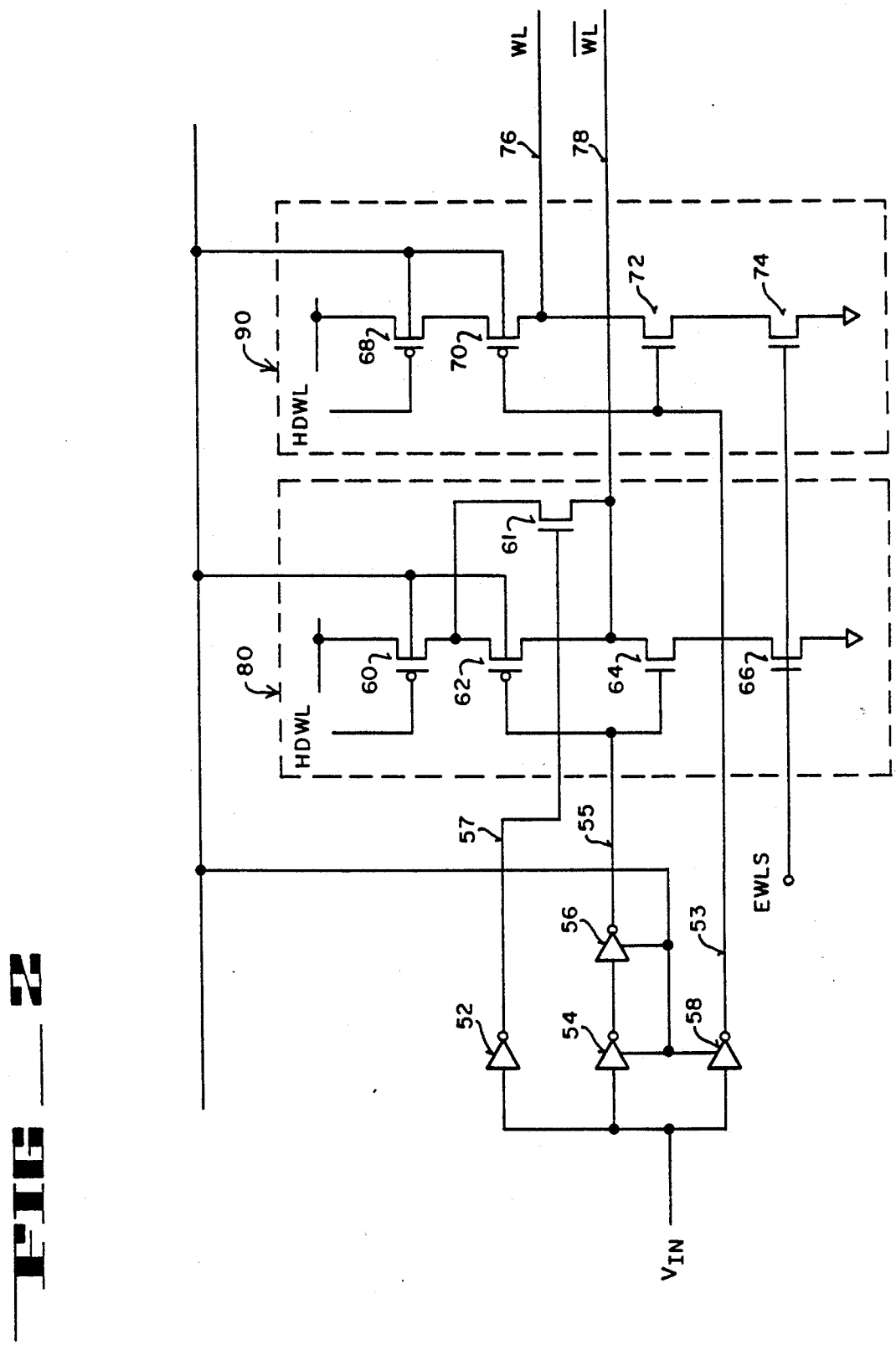
FIG_2

HIGH SPEED INPUT RECEIVER AND WORDLINE DRIVER CIRCUIT

FIELD OF THE PRESENT INVENTION

The present invention relates to the field of semiconductor circuits. More particularly, the present invention relates to high speed input receiver circuits directly interfacing with wordlines of a memory array.

BACKGROUND OF THE INVENTION

FIG. 1 shows the typical input receiver wordline driver circuit of the prior art generally shown by 10. This circuit is designed to interface with wordlines such as wordline 34 and wordline 36. These wordlines may also be driven by high voltage drivers located elsewhere in the semiconductor chip to approximately twelve volts during the programming of the memory array. Therefore, the input receiver and wordline driver circuit 10 is designed so as to be able to interface with wordlines 34 and 36 and to accommodate possible high voltages on these wordlines. For example, circuit 10 must be able to isolate the ground voltage or the supply voltage from wordlines 34 and 36 when these wordlines are driven to a high voltage.

Inverter 12, which is typically designed to respond to TTL input levels, drives a buffer 50. Buffer 50 provides a sufficiently strong drive and sharp rise and fall edges to drive wordline 34. Thus, the combination of inverter 12 and buffer 50 is dedicated to drive wordline 34. Since, as stated above, wordline 34 may be driven to a high voltage of approximately twelve volts, buffer 50 is also used to isolate the possible high voltage on wordline 34 from the ground voltage.

Transistors 26 and 32 are used to perform this isolation of any high voltage on wordline 34 from the supply voltage and the ground voltage respectively. Transistor 26 is used to isolate the possible high voltage on wordline 34 from the supply voltage. The gate of transistor 26 is driven by signal HDWL as shown in FIG. 1. This signal switches to a high state, and thus turns off p-channel transistor 26, whenever wordline 34 is driven by a high voltage driver. Thus, when wordline 34 is being driven by a high voltage driver the electrical path between that wordline and the supply voltage is cut off by the action of signal HDWL and transistor 26 as described above. Similarly, transistor 32 is employed to isolate the possible high voltage on wordline 34 from the ground voltage. The gate of transistor 32 is driven by signal EWLS as shown in FIG. 1. This signal switches to a low state, and thus turns off n-channel transistor 32, whenever wordline 34 is driven by a high voltage driver. Thus, when wordline 34 is being driven by a high voltage driver the electrical path between that wordline and the ground voltage is cut off by the action of signal EWLS and transistor 32 as explained above.

Transistors 28 and 30 of buffer 50 are responsible for driving wordline 34. Transistors 28 and 30 respond to the variations on their common gate 15. The common gate 15 is driven by inverter 12 and shown in FIG. 1. Thus, the combination of inverter 12 and buffer 50 is a non-inverting combination which drives wordline 34 in response to variations in the input VIN of inverter 12.

In a similar manner, inverters 14 and 16 along with buffer 40 drive wordline 36. Like buffer 50, buffer 40 performs the function of providing a strong drive for wordline 36 as well as performing the function of isolating any high voltage on wordline 36 from the supply voltage or ground voltage lines. However, unlike the combination of inverter 12 and buffer 50, the combination of inverters 14, 16 and buffer 40 is an inverting combination. Thus, wordline 16 and buffer 40 is an inverting combination. Thus, wordline 36 represents an inverted version of wordline 34. Because of the additional inverter use to create the inverted wordline 36, wordline 36 makes its transitions with an added delay as compared to the transitions of wordline 34. In particular, the low to high transitions of wordline 36 are delayed, by one inverter delay time, from the low to high transitions of wordline 34.

It is therefore an object of the present invention to create an inverted version of a wordline, without rendering the low to high transition of the inverted wordline slower than the low to high transition of the non-inverted wordline.

SUMMARY OF THE INVENTION

The present invention discloses apparatus and methods of increasing the speed of an input receiver circuitry which directly interfaces the wordlines of a memory array. The speed of the input receiver and wordline driver circuit of the present invention is improved such that both the inverted and non-inverted wordlines achieve the same low to high transision speed. This improvement is achieved by the addition of an inverter and a look-ahead n-channel transistor coupled to the basic wordline driver buffer circuit of the present invention.

BRIEF DESCRIPTION OF THE DRAWINGS

The present invention will be understood more fully from the detailed description which follows and from the accompanying drawings, which, however, should not be taken to limit the invention to the specific embodiments shown but are for explanation and understanding only.

FIG. 1 shows the prior art input receiver and wordline driver circuit.

FIG. 2 shows the input receiver and wordline driver circuit of the present invention.

DETAILED DESCRIPTION

FIG. 2 shows the circuit of the present invention. In general, the circuit of FIG. 2 is functionally similar to that of FIG. 1. For example the function of buffer 80 of FIG. 2 generally corresponds to that of buffer 50. Further, inverters 54, 56, and 58 of FIG. 2 correspond to inverters 14, 16 and 12 of FIG. 1 respectively.

The primary difference, however, between the present invention and the prior art is the inclusion of inverter 52 and n-channel transistor 61. Transistor 61 is referred to as a "Look Ahead" transistor, and its combination with inverter 52 results in several important advantages over the prior art circuit of FIG. 1. These advantages, which will be described below, cause the inverted wordline 78 to make its low-to-high transition just as quickly as the low-to-high transitions of the non-inverted wordline 76. Thus, the circuit of the present invention eliminates the added delay of the inverted wordline in making its low to high transitions.

The improvement in the low-to-high transition of wordline 78 results from the combination of inverter 52 and the Look Ahead transistor 61 in at least three distinct ways.

First, because the pull-up transistor 61 is an n-channel device, its gate needs to be driven high in order to raise the voltage of wordline 78. In contrast, the gate of the p-channel pull-up device 62 must be driven low in order to raise the voltage of wordline 78. Therefore, the gate 57 of n-channel transistor 61 requires one less inversion as compared to the path from input VIN to gate 55 of transistor 62. Because of this, only one inverter, namely inverter 52, is used to drive gate 57 of transistor 61 as opposed to the two inverters 54 and 56 used to drive gate 55 of transistor 62. Thus, the utilization of one less inverter is the first way that the low to high transition time of the inverted wordline 78 is reduced.

The second means by which the low to high transition time of the inverted wordline 78 is reduced is that an n-channel transistor has a higher "mobility" than a p-channel transistor, therefore, an n-channel transistor is ordinarily quicker than a p-channel transistor. Although the "body effect" on the threshold voltage of an n-channel transistor, when used in a pull-up configuration, reduces the speed of the n-channel transistor, the utilization of an n-channel transistor still helps the speed of buffer 80 of the present invention. The reason for this is that the "body effect" on the threshold voltage of an n-channel transistor is negligible for source voltages below two volts. Thus, the low to high transition time of wordline 78 before the wordline reaches two volts is tremendously reduced because of the use of the n-channel transistor 61. Even after the voltage of wordline 78 has exceeded two volts, n-channel transistor 61 still has some speed advantage over p-channel transistor 62, although the speed advantage is reduced because of the increased impact of the "body effect" discussed above. Therefore, utilizing n-channel transistor 61, in itself, gives rise to a reduction of delay time because of the inherent speed advantage of n-channel transistor 61 over the p-channel transistor 62.

The third means by which the low to high transition time of the inverted wordline 78 is reduced is that, for the same transistor gate width, n-channel transistor 61 has less gate capacitance than p-channel transistor 62 in the particular EPROM process employed. The reason for this is that n-channel transistors are usually fabricated with a lower channel gate length than p-channel transistors. Therefore, for the same gate widths of n-channel transistor 61 and p-channel transistor 62, the gate area of n-channel transistor 61 is less that the gate area of p-channel transistor 62. Because of this, the gate capacitance of n-channel transistor 61 is less than the gate area of p-channel transistor 62, even though both transistors have the same gate width. As such, the capacitive load on inverter 52 is less than the capacitive load on inverter 56. Therefore, n-channel transistor 61 may be driven quicker than p-channel transistor 62 because of the reduced capacitive load that n-channel transistor 61 represents to its driver as compared to the capacitive load that p-channel transistor 62 represents to its respective driver. As such, n-channel transistor 61 represents an improvement in speed over p-channel transistor 62 in this third way.

Because of the above three speed advantages of the present invention, the low to high transition time of wordline 78 is significantly reduced. Using the combination of inverter 52 and n-channel transistor 61 of the present invention, the low to high transition time of wordline 78 is typically improved by about 30% over the low to high transition time of wordline 36 of the prior art circuit of FIG. 1. This 30% speed improvement makes the low to high transition of wordline 78 as quick as the low to high transition of wordline 76 and thus achieves the object of the present invention of equalizing to low to high transition times of the inverted and non-inverted wordlines.

It is noted that the pull-up branch of buffer 80 still consists of the p-channel transistors 62 and 60 in addition to the added n-channel transistor 61. It is noted that n-channel transistor 61 wil be cut off at a wordline voltage of approximately 3.5 volts (assuming a 5.0 volts supply voltage). Thus, p-channel transistor 62 is still used to bring the wordline voltage all the way up to 5.0 volts. Although the wordline speed beyond 3.5 volts is not critical, it is important to eventually raise the wordline voltage to 5.0 volts to provide a sufficiently high voltage for the operation of the memory cells in the array. Thus, p-channel transistor 62 ensures a voltage of 5.0 volts on wordline 78. Furthermore, p-channel transistor 60 is still used to cut off the electrical path from the supply voltage to wordline 78 whenever wordline 78 is being driven by high voltage drivers (the high voltage drivers are not a part of the prior art of the present invention and thus are not shown in either FIG. 1 or FIG. 2).

Finally, while the input receiver and wordline driver circuit of the present invention has been disclosed and described with respect to the preferred embodiments thereof, it will be understood that the input receiver and wordline driver circuit of present invention may be varied without departing from the spirit and scope thereof.

We claim:

1. An interface circuit for providing first and second output logic signals at respective first and second wordlines of a memory array in response to an input logic signal, said second output logic signal being the inverse of said first output logic signal, said circuit comprising:
   inverter means for producing inverted and non-inverted logic signals in response to said input logic signal;
   first and second buffer circuits each comprising a pair of complementary transistors coupled in an inverter configuration between first and second operating potentials, said first buffer circuit being coupled to receive said non-inverted logic signal and produce said second output logic signal on said second wordline, and said second buffer circuit being coupled to receive said inverted logic signal and produce said first output logic signal on said first wordline in response thereto;
   wherein said first and second buffer circuits each include a means for isolating a high potential appearing on said first and second wordlines from said first and second operating potentials;
   said first buffer circuit further comprising an n-channel transistor coupled between said second wordline and said first operating potential through said isolating means, said n-channel transistor having its gate coupled to an inverted logic signal, said n-channel transistor increasing the low-to-high transition of said second output logic signal in response to a high-to-low transition of said input logic signal.

2. The circuit of claim 1 wherein said inverter means comprises a first inverter having its output coupled to said second buffer circuit, and a second inverter having its output coupled to the gate of said n-channel transistor, both of said first and second buffer circuits providing said inverted logic signal.

3. The circuit of claim 2 wherein said inverter means further comprises third and forth inverters coupled in series to provide said non-inverted logic signal to said first buffer circuit.

4. The circuit of claim 3 wherein said isolating means comprises a p-channel transistor and an additional n-channel transistor coupled in series along with said pair of complementary transistors, said p-channel transistor being coupled between said pair of complementary transistors and said first operating potential, with said additional n-channel transistor being coupled between said pair of complementary transistors and said second operating potential, the gates of said p-channel and additional n-channel transistors being driven by respective first and second switching signals, said first and second switching signals turning said p-channel and additional n-channel transistors off whenever said high potential appears on said first or said second wordlines.

* * * * *